United States Patent [19]

Clark et al.

[11] 4,299,866

[45] Nov. 10, 1981

[54] COATING PROCESS MASK

[75] Inventors: Roger J. Clark, Jericho; Robert E. Kennison, Essex, both of Vt.

[73] Assignee: International Business Machines Corporation, Armonk, N.Y.

[21] Appl. No.: 62,377

[22] Filed: Jul. 31, 1979

[51] Int. Cl.$^3$ .............................................. C23C 13/00
[52] U.S. Cl. .................................... 427/255.6; 427/99; 427/255; 427/259; 427/282; 427/336; 427/416
[58] Field of Search .......... 427/248 H, 282, 154–156, 427/255, 99, 255.6, 254, 336, 416

[56] References Cited

U.S. PATENT DOCUMENTS

| | | | |
|---|---|---|---|
| 2,991,188 | 7/1961 | Wing et al. | |
| 3,055,777 | 9/1962 | Grad | 427/282 |
| 3,309,227 | 3/1967 | McTeague | 427/154 |
| 3,892,892 | 7/1975 | Hofer | |
| 3,895,135 | 7/1975 | Hofer | 427/248 H |
| 3,900,600 | 8/1975 | Spaulding | 427/99 |
| 3,928,661 | 12/1975 | Higbee et al. | 427/259 |
| 4,127,680 | 11/1978 | Shirn et al. | 427/259 |

FOREIGN PATENT DOCUMENTS

48-093747  8/1973  Japan .................................. 427/336

OTHER PUBLICATIONS

*IBM Technical Disclosure Bulletin*, "Protecting Module Pins from Resin Contamination", Nov. 1970, vol. 13, #6, p. 1608.

*Primary Examiner*—Michael R. Lusignan
*Assistant Examiner*—Janyce A. Bell
*Attorney, Agent, or Firm*—Francis J. Thornton

[57] ABSTRACT

This invention describes a method of masking a workpiece to prevent the adhesion of a deposited tightly adhering conformal coating formed from the condensation of a vaporous diradical such as paraxylylene on selected portions of the workpiece. Specifically the process of the invention requires the covering of the areas of the workpiece, to which adhesion is not desired, with a non-polymerizing hydrocarbon and placing the covered area in close contact with an open cellular material containing a predominance of interconnecting cells which provides a large surface area for condensation of the unwanted condensate of the diradical, exposing the workpiece to the vaporous diradical, removing the workpiece from the open cellular material and immersing the workpiece in a solvent for swelling and dissolving the hydrocarbon covering.

8 Claims, 6 Drawing Figures

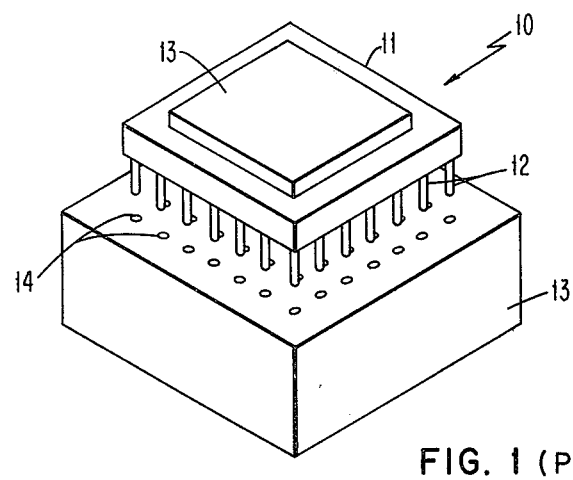
FIG. 1 (PRIOR ART)
FIG. 2 (PRIOR ART)
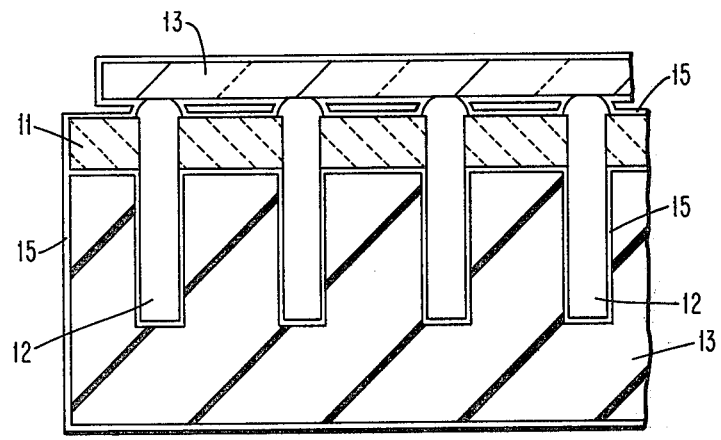

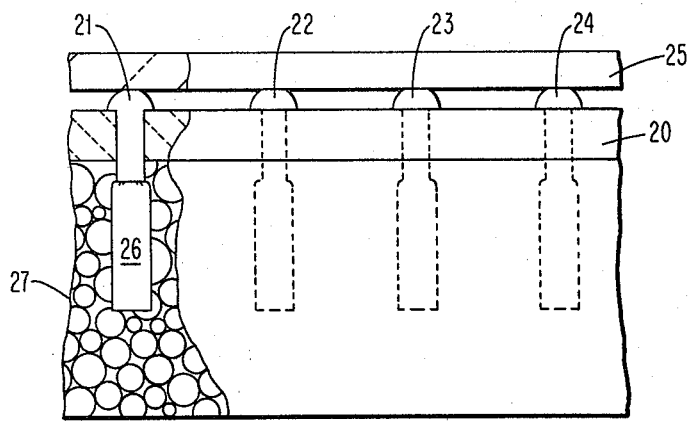
FIG. 3
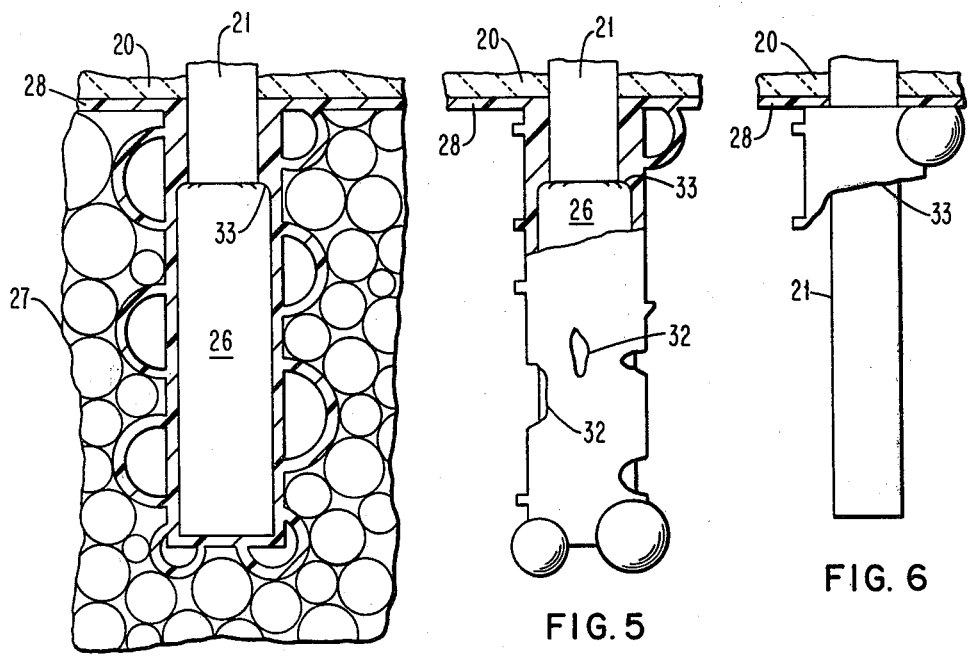
FIG. 4
FIG. 5
FIG. 6

COATING PROCESS MASK

BACKGROUND OF THE INVENTION

1. Field of the Invention

This invention relates to a method of masking bodies to prevent the adhesion of a tightly adhering, vapor deposited, comformal coating on selected portions of the body.

2. Description of the Prior Art

Vapor deposition coatings are known to be applied to various workpieces. The chemistry of certain coatings such as the polymer coatings formed from the condensation of vaporous diradical materials such as the P-xylylene monomers makes them unique, tightly adhering conformal polymer coatings having a molecular weight of approximately 500,000. Once these materials condense on the workpiece they are not only totally conformal and tightly adhering but very tenacious since they are also very chemical resistant.

These very properties that make such coating desirable also cause difficulties where only certain areas of the workpiece is to be coated. In the past the coating on selected areas were either mechanically removed after coating by brushing, scraping, peeling or the like or were mechanically masked prior to coating.

One mechanical masking technique is taught in U.S. Patent 3,895,135 issued July 15, 1976, to P. Hofer. This patent describes a complex mechanical masking process in which that portion of the surface of the body which is not to be coated is masked so as to provide a constricted flow path for the vapors of the material being deposited. This constriction is claimed to create, along the interface between the masked and unmasked portions of the substrate, a relatively thin region in the deposited coating at the end of the flow path. This thin region was then used as a tearline so that upon mechanical removal of the masking means the coating would tear along this line and be removed along with the mask.

However it has now been found that when such materials are deposited in a deposition chamber maintained at an operating pressure in the order of 100 millitorr or less that the vapor is so highly penetrent that it will coat an area normally inaccessable and will in fact penetrate under masks mechanically held on the surface of a workpiece.

Moreover because of the small sizes of integrated circuits and particularly because of their detailed complexity, mechanical masking means have not been found to be suitable.

OBJECTS OF THE PRESENT INVENTION

It is therefore an object of the present invention to provide a simplified effective masking process which permits the easy and ready removal of tightly adhering conformal coatings from integrated circuits, and other fine, small delicate objects.

It is a further object of the present invention to provide a masking process which facilitates the removal of condensation coatings of monomers of vaporous diradicals formed at low pressures from a condensable vapor precursor of the monomer of the coating material.

It is another object of the present invention to provide a relatively inexpensive and safe chemical technique which will remove such conformal coatings from selected areas without adversely affecting the coated workpiece or associated materials.

BRIEF DESCRIPTION OF THE DRAWINGS

These and other objects of the invention can be further appreciated and understood from the following drawings in which;

FIG. 1 shows an isometric view of a semiconductor module having a multiplicity of leads extending therefrom and a mechanical mask for the leads.

FIG. 2 shows a cross section of a portion of the module of FIG. 1 inserted in the mechanical mask of FIG. 1 and coated with paraxylylene.

FIG. 3 illustrates a cross section of a semiconductor module masked in accordance with the present invention and mounted in a polyfoam holder.

FIG. 4 illustrates a greatly enlarged cross sectional view of one of the leads shown in FIG. 3 after coating with paraxylylene.

FIG. 5 illustrates the lead of FIG. 4 after removal from the polyfoam holder.

FIG. 6 illustrates the lead after the hydrocarbon mask has been dissolved.

SUMMARY OF THE PRESENT INVENTION

The present invention describes a method of masking selected portions of a workpiece to prevent the adhesion of a tightly adhering vapor deposited conformal coating formed from the condensation of vaporous diradicals on the selected portions. The present invention can also be used to selectively prevent the adhesion of polymers deposited on the workpiece from a liquid.

Basically the process teaches the coating of the areas to which adhesion is not desired with a non-polymerizing hydrocarbon, exposing the mounted unit to the monomer precursor of a polymer in liquid or vapor from the monomer to polymerize thereon, creating openings in the polymer, and immersing the workpiece in a solvent that will swell the underlying non-polymerizing hydrocarbon and cause the removal of the tightly adhering conformal polymer coating overlying the hydrocarbon.

More specifically the process teaches the coating of the areas to which adhesion is not desired with a non-polyimerizing hydrocarbon, mounting the coated area in close contact with an open cellular body containing a predominance of interconnecting cells which provide a large surface area, exposing the mounted unit to the vapor of the diradical, removing the open cellular body from the workpiece thereby by creating openings in the condensate, and immersing the workpiece into a solvent that will swell the underlying non-polymerizing hydrocarbon and cause the removal of the tightly adhering conformal condensate coating overlying the hydrocarbon.

Referring now to the drawings the workpiece 10, shown in FIG. 1, is a ceramic substrate 11 having a plurality of leads 12 passing therethrough. Each lead 12 is connected to a semiconductor, integrated circuit chip 13 by the well known so called, flip chip method. Positioned beneath the workpiece is a mechanical mask 16 which is prior art used in an attempt to prevent in the adhesion of vapor deposited material to the leads 12 extending from the bottom of ceramic substrate 11.

Because these leads 12 are used as electrical connections to the integrated circuit chip 13 it is necessary that they be free of coatings that will interfere with good electrical connections. The mechanical mask 16 shown in FIG. 1 and 2 is a conformal rubber mat provided with a plurality of holes 14 corresponding to each of the leads 12. These holes 14 are molded in the rubber mat with and have an inner diameter less than the outer diameter of the pin so that the pins will fit tightly in the holes 14. Paraxylylene is one material which is formed by the condensation of a vaporous diradical.

Paraxylylene coatings are usually formed by condensation of a vapor of a P-xylylene monomer produced by pyrolytic cleavage in a pyrolysis zone of one or more cyclic dimers. Condensation of these monomers to form the paraxylylene coating can be accomplished at any temperature below the decomposition temperature of the coating which is usually less than 250° C. However the colder the substrate on which the condensation is to occur the faster the condensation rate. It has been found necessary when coating workpieces of the type shown in FIG. 1 that operating pressures in the order of 100 millitorr be used so that coating of the surface of the chip lying between the chip and substrate will take place. This low pressure results in a molecular mean free path of less than 0.2 millimeters. This means that the vapor penetrates very deeply in small crevices and holes and has been found to extend down into the holes 14 in the mat 16 to cover the leads 12 as coating 15. This unique penetrating ability of the vapor even into small regions and holes is one of the reasons why it creates such a tight conformal coating and provides total coverage of the workpiece. However, it is the same characteristic which makes it virtually impossible to prevent it from coating areas where coverage is not desired.

Although the paraxylylene condensate is soluble in chlorobenzine at 150° and in strong bases such as sodium hydroxide at 150° C., the use of such materials is contraindicated because they will adversely attack materials such as aluminum which is used on the semiconductor chip. Moreover it is difficult to provide suitable etching masks for such strong chemicals.

Because mechanical masking means such as mats, were found to be unsuitable and chemical etching means unsatisfactory the present invention was devised.

A more detailed understanding of the masking process of the present invention can be best understood from the following description taken in conjunction with FIGS. 3, 4, 5 and 6. Shown in FIG. 3 is a partial section of a portion of a ceramic semiconductor substrate 20 having a plurality of leads 21, 22, 23 and 24 passing there through. These leads are bonded in the ceramic of the substrate and at one end to a body 25 of semiconductor material having an integrated circuit formed therein. Each lead 21, 22, 23 and 24 is coated along a portion of its length with a non-polymerizing hydrocarbon 26. Beeswax or material sold under the name of Apiezon W are typical suitable hydrocarbons. The hydrocarbon may be filled with crepe rubber or any other suitable inorganic filler to thermally stabilize it. The hydrocarbon must also be soluble and swellable in a solvent such as, for example, tolulene, xylene or perchloroethylene. Any solvent which is compatible with the other materials used in semiconductor manufacture or assembly is suitable. Other solvents such as trichloroethylene, benzene, kerosene, carbon disulfide, mineral spirits or carbon tetrachloride could also be used, but are not desired because of health or inflamability issues.

The masking filled hydrocarbon is prepared for use by dissolving it in a solvent such as toluene, xylene or perchloroethylene with the hydrocarbon ranging between 10 and 40% by weight so that the viscosity range of the solution is between 22 and 32 Zahn-seconds. This measured at 21° C. by utilizing a Zahn viscometer with an orifice size of 0.078 inches.

Once the proper viscosity of the hydrocarbon is obtained, the area to be kept free of paraxylylene is coated with the hydrocarbon. As shown in FIG. 3 the leads 21, 22, 23 and 24 are coated by simply dipping the unit into the hydrocarbon solution.

By controlling the viscosity of the solution to be within the described limits the extent of the climb of the wax on the pins is limited by the surface tension of the wax solution during the coating of the regions requiring masking. Moreover, control of the viscosity also assures that an adequate thickness of the hydrocarbon is deposited on the areas to be masked.

It should be understood that other viscosities and other materials or both in regards to the hydrocarbon described and the solvents utilized can be used.

Once the leads 21, 22, 23 and 24 have been coated with the hydrocarbon they are inserted into an open cell, rigid plastic sheet 27 such as rigid urethane foam, which has a compressive strength of between 20 and 95 psi, a compressive modulas of 400 to 3500 psi, a shear strength of 20 to 70 psi, and a shear molulus of 250 to 800 psi and which is provided with a predominance of interconnecting cells.

Such materials can be produced by reacting low molecular weight polyols, with a functionality of two or more, with polymeric isocyanates in the presence of catalysts, surfactant and blowing agents. Either polyether or polyester polyols can be used to manufacture this type of foam. Other materials can be also used to manufacture such a foam including urea-formaldehyde, polyvinyl, polyvinyl chloride or the like. The only requirement being that the foam meet the mechanical properties of the open cellular rigid plastic sheet noted above.

By using an open cellular foam the leads will easily penetrate therethrough so that the coated leads will pass through the open cells of the foam with only the walls of the cells of the foam, as shown in FIG. 3, in contact with the hydrocarbon coating 26 deposited on the surface of the leads. The cells ruptured by passage of the leads will provide a large surface area in contact with the lead. Once the substrate is mounted onto the foam sheet it is placed in a pyrolysis chamber and the chamber evacuated to a pressure of less than 100 millitorr. The evacuated chamber is now filled with a suitable condensing monomer such as P-xylylene which covers the entire unit and also penetrates into the ruptured cells and around the leads to condense as a paraxylylene coating 28 as shown in FIG. 4 which depicts a greatly enlarged view of lead 21 of FIG. 3 in the foam 27. The ruptured cells of the foam 27 provides large surface areas for condensation of the monomer that penetrates through to the region around each lead. Thus the amount of paraxylylene that is condensed on the lead in the region where it is in contact with an open cell is reduced and is thinner on the leads than is the condensate deposited on the more exposed surfaces of the unit being coated.

When the condensation of the paraxylylene is complete the unit is removed from the deposition chamber and the substrate 20 pulled away from the foam supporting it. When the foam is pulled away some of the paraxylylene coating on the interior of the cell remains in the cell and tears away from the hydrocarbon coating 26 causing small openings 32 to appear in the paraxylylene coating 28 on the leads as shown in FIG. 5.

Thus the contact of the cell walls with the wax causes, upon removal of the unit from the foam, tearing of small openings 32 in the paraxylylene coating 28 where it is extended or bridged from the lead wall to the wall of the cell. This tearing action produces many small potential sites through which the solvent may penetrate.

After removal from the foam the leads are immersed into a bath of a solvent such as toluene, xylene or perchloroethylene which will not attack the paraxylylene coating 28 but will penetrate the openings 32 to initially swell the underlying hydrocarbon coating 26 and then dissolve it. As the coating 26 swells it causes the paraxylylene coating on the lead to tear off at the point 33 where the wax terminates on the lead. Rupturing of the coating occurs at this point partially because the material tends to be reduced in thickness over the hydrocarbon and partially because the paraxylylene coating 28 is tightly held on and conformed to the lead 22.

As the underlying hydrocarbon dissolves the paraxylylene coating overlying it tears away and falls off leaving the underlying lead 22 free of any residue that would interfere with future electrical connection to the lead.

In summary, the substrate is cleared in the usual manner and the leads of the substrate coated, to the level desired, with a mixture of wax or hydrocarbon having a viscosity whose nominal value is 27 Zahn-seconds at 21° C. The coating of wax may be applied to the module through well known equipment similar to the known wave soldering equipment thus controlling the amount of coating mixture coverage and providing a high volume thruput. The coated hydrocarbon is thourghly dried by, for example, passing the coated unit through an oven.

Following drying of the hydrocarbon coating the unit is pushed into a rigid polyurethane sheet such that the coated leads are firmly sited in the rigid polyurethane sheet. Following which the entire foam sheet is loaded into a coating chamber. The pressure of the chamber is now reduced to about 100° millitorr and the monomer vapor introduced into the partially evacuated chamber at the desired temperature such that the condensate of the monomer on the unit will create the polyparaxylylene coating. Once this coating has been accomplished the unit is removed from the chamber and the modules removed from the sheet.

Removal of the modules from the foam produces numerous tears and openings in the paraxylylene coating such that when the coated units are now immersed into a suitable solvent such as xylene, the underlying hydrocarbon coating is first swelled and then dissolved. The swelling of the hydrocarbon material causes the paraxylylene coating overlying the waxed area to be torn lose causing it to fall off the leads as the underlying hydrocarbon continues to swell and dissolve in the solvent. The time required to remove the hydrocarbon and the overlying paraxylylene coating can be decreased by placing the unit in an agitated bath of solvent material or an ultrasonic bath.

This technique completely removes the conformal coating from the leads so that the leads will now be able to make good electrical connections to suitable terminals.

While the invention has been particularly shown and described with reference to a preferred embodiment thereof, it will be understood by those skilled in the art that various changes in form and details may be made therein without departing from the spirit and scope of the invention.

What is claimed is:

1. In a process for removing a polymer from a defined area on a body by masking the defined area on the body which is to be coated with a polymer the improvement comprising the steps of:
   coating the defined area with a swellable, dissolvable, non-polymerizable hydrocarbon,
   coating the body with a polymer,
   applying an external force to said polymer coating over said defined area sufficient to create openings in said polymer coating over said defined area, and
   immersing the body in a swelling agent for said swellable, dissolvable, non-polymerizable hydrocarbon that will penetrate said openings and swell and dissolve said hydrocarbon to rupture and remove the polymer from said defined area while leaving the remainder of the body coated with the polymer.

2. The process of claim 1 wherein said polymer is formed from a monomer vapor.

3. The process of claim 1 wherein said polymer is paraxylylene.

4. The process of claim 3 wherein after said body is coated with said hydrocarbon and before coating the body with said polymer there is further provided a step of maintaining an open cellular plastic foam on said defined area during the deposition of the paraxylylene and the step of applying an external force to said polymer coating consists of removing the foam when said deposition is completed.

5. The process of claim 4 wherein said foam is formed by reacting low molecular weight polyols with a functionality of two or more with polymeric isocyanates in the presence of catalysts, surfactants, and blowing agents.

6. The process of claim 5 wherein said polyol is a polyether.

7. The process of claim 6 wherein said polyol is a polyester.

8. The process of claim 1 wherein said hydrocarbon when coated on the body is at a viscosity of between 22 and 32 Zahn-seconds.

* * * * *